US012120816B2

(12) United States Patent
Sung et al.

(10) Patent No.: US 12,120,816 B2
(45) **Date of Patent: *Oct. 15, 2024**

(54) MICRO-ROUGHENED ELECTRODEPOSITED COPPER FOIL AND COPPER CLAD LAMINATE

(71) Applicant: CO-TECH DEVELOPMENT CORP., Taipei (TW)

(72) Inventors: Yun-Hsing Sung, Taoyuan (TW); Shih-Shen Lee, New Taipei (TW); Hung-Wei Hsu, Yun Lin County (TW); Chun-Yu Kao, Yunlin County (TW)

(73) Assignee: CO-TECH DEVELOPMENT CORP., Taipei (TW)

( * ) Notice: Subject to any disclaimer, the term of this patent is extended or adjusted under 35 U.S.C. 154(b) by 709 days.

This patent is subject to a terminal disclaimer.

(21) Appl. No.: 17/355,515

(22) Filed: Jun. 23, 2021

(65) Prior Publication Data

US 2021/0321514 A1 Oct. 14, 2021

Related U.S. Application Data

(62) Division of application No. 16/899,630, filed on Jun. 12, 2020, now abandoned.

(Continued)

(51) Int. Cl.

*H05K 1/03* (2006.01)
*B32B 3/30* (2006.01)

(Continued)

(52) U.S. Cl.

CPC ............ *H05K 1/0306* (2013.01); *B32B 3/30* (2013.01); *B32B 7/12* (2013.01); *B32B 15/04* (2013.01);

(Continued)

(58) Field of Classification Search

CPC .......... H05K 1/0306; B32B 3/30; B32B 7/12; B32B 15/04; B32B 15/20; B32B 2250/02; B32B 2457/08

See application file for complete search history.

(56) References Cited

U.S. PATENT DOCUMENTS 11,047,061 B2 * 6/2021 Sung ........................ C25D 1/04
11,053,602 B2 * 7/2021 Sung ........................ C25D 1/04

(Continued)

FOREIGN PATENT DOCUMENTS

CN 102362559 2/2012
CN 111031663 4/2020

(Continued)

OTHER PUBLICATIONS

Japan Patent Office "Submission of the publication" Application No. 2021-177752, Nov. 29, 2022, Japan.

(Continued)

*Primary Examiner* — Michael Zhang
(74) *Attorney, Agent, or Firm* — WPAT, P.C

(57) ABSTRACT

Provided is a micro-roughened electrodeposited copper foil, which comprises a micro-rough surface and multiple copper nodules. The micro-roughened electrodeposited copper foil has an Rlr value of 1.05 to 1.60, or an Sdr of 0.01 to 0.08. With the surface characteristics, the electron path distance can be shortened, such that the micro-roughened electrodeposited copper foil can reduce the insertion loss of the copper clad laminate at high frequencies and have the desired peel strength.

9 Claims, 11 Drawing Sheets

Related U.S. Application Data

(60) Provisional application No. 62/863,819, filed on Jun. 19, 2019.

(51) Int. Cl.

| | |
|---|---|
| ***B32B 7/12*** | (2006.01) |
| ***B32B 15/04*** | (2006.01) |
| ***B32B 15/20*** | (2006.01) |

(52) U.S. Cl.

CPC .......... *B32B 15/20* (2013.01); *B32B 2250/02* (2013.01); *B32B 2457/08* (2013.01); *H05K 2201/0338* (2013.01)

(56) References Cited

U.S. PATENT DOCUMENTS

| | | | | |
|---|---|---|---|---|
| 2020/0270413 | A1* | 8/2020 | Koes ........................ | C08J 5/244 |
| 2020/0392640 | A1 | 12/2020 | Sung | |

FOREIGN PATENT DOCUMENTS

| | | |
|---|---|---|
| JP | 2018141228 | 9/2018 |
| JP | 2020045563 | 3/2020 |
| JP | 2020050954 | 4/2020 |
| TW | I405510 | 8/2013 |
| TW | 202012706 | 4/2020 |
| WO | WO2013065730 | 4/2015 |
| WO | 2016174998 | 11/2016 |
| WO | 2017006739 | 1/2017 |
| WO | 2017138338 | 8/2017 |
| WO | 2018198905 | 11/2018 |
| WO | WO2018110579 | 12/2018 |
| WO | WO2018181061 | 4/2019 |

OTHER PUBLICATIONS

Sung, U.S. Appl. No. 62/863,819 "Micro-Roughened Electrodeposited Copper Foil (VG411)", Dec. 24, 2020, USPTO, USA.

Sierra Circuits, "Why FR4 Material is Commonly used in PCB Fabrication?", 2022, Sierra Circuits.

* cited by examiner

| Length | No. |
|---|---|
| 550nm | 1B-01 |
| 390nm | 1B-02 |
| 1367nm | 1B-03 |
| 1368nm | 1B-04 |
| 2130nm | 1B-05 |
| 1005nm | 1B-06 |
| 2466nm | 1B-07 |
| 866nm | 1B-08 |
| 587nm | 1B-09 |
| 573nm | 1B-10 |

| Length | No. |
|---|---|
| 711nm | 2B-01 |
| 969nm | 2B-02 |
| 953nm | 2B-03 |
| 1172nm | 2B-04 |
| 626nm | 2B-05 |
| 904nm | 2B-06 |
| 863nm | 2B-07 |
| 444nm | 2B-08 |
| 999nm | 2B-09 |
| 714nm | 2B-10 |

| Length | No. |
|---|---|
| 530nm | 3B-01 |
| 585nm | 3B-02 |
| 539nm | 3B-03 |
| 645nm | 3B-04 |
| 815nm | 3B-05 |
| 808nm | 3B-06 |
| 922nm | 3B-07 |
| 1502nm | 3B-08 |
| 810nm | 3B-09 |
| 1115nm | 3B-10 |

| Laminate | | | | | | | |
|---|---|---|---|---|---|---|---|
| | | Characteristic Impedance Z of Micro Strip (ohms) | | | | 85 | |
| | | Characteristic Impedance Z of Strip Line (ohms) | | | | 85 | |
| | | Tolerance of Characteristic Impedance Z | | | | ±10% | |
| | | Design of Characteristic Impedance | | | | Differential | |
| Layer No. | Description | Thickness (mil) | Tolerance (mil) | Glass fiber fabric X number | Dielectric Constant (Er) | Line width (mil) | Line spacing (mil) |
| | Solder resist (green paint) | 0.60 | — | — | 3.8 | — | — |
| L1 | Copper foil | 1.95 | — | — | — | **5.5** | **8.5** |
| | Prepreg | 2.70 | ±0.709 | 1080x1 | 3.7 | — | — |
| L2 | Copper foil | 1.30 | — | — | — | — | — |
| | Prepreg | 4.00 | ±0.709 | 106x2 | 3.7 | — | — |
| L3 | Copper foil | 1.30 | — | — | — | **6.75** | **6.25** |
| | Prepreg | 12.35 | ±1.97 | 106x1 + 2116x2 + 106x1 | 3.7 | — | — |
| L4 | Copper foil | 1.30 | — | — | — | — | — |
| | Prepreg | 15.00 | ±1.97 | 2116x3 | 3.7 | — | — |
| L5 | Copper foil | 1.30 | — | — | — | — | — |
| | Prepreg | 9.35 | ±1.5 | 2116x2 | 3.7 | — | — |
| L6 | Copper foil | 1.30 | — | — | — | **5.5** | **8.75** |
| | Prepreg | 3.00 | ±0.709 | 1080x1 | 3.7 | — | — |
| L7 | Copper foil | 1.30 | — | — | — | — | — |
| | Prepreg | 3.70 | ±0.709 | 3313x1 | 3.7 | | |
| L8 | Copper foil | 1.95 | — | — | — | **6.8** | **5.8** |
| | Solder resist (green paint) | 0.60 | — | — | 3.8 | — | — |
| | | **63.00** | **±10%** | | | | |

FIG.5

MICRO-ROUGHENED ELECTRODEPOSITED COPPER FOIL AND COPPER CLAD LAMINATE

CROSS-REFERENCE TO RELATED APPLICATION

This application is a divisional application of Nonprovisional patent application Ser. No. 16/899,630, filed on Jun. 12, 2020, which claims the benefit of the priority to U.S. Provisional Patent Application No. 62/863,819, filed on Jun. 19, 2019. All prior-filed patent applications are incorporated by reference herein in its entirety.

BACKGROUND OF THE INVENTION

1. Field of the Invention

The present invention relates to a copper foil, especially an electrodeposited copper foil and a copper clad laminate comprising the electrodeposited copper foil.

2. Description of the Prior Arts

With the rapid development of the electronic and information industries, high-frequency high-speed signal transmission has become a research and development goal in many fields. To meet the high-speed signal transmission requirements for the electronic products, the first technology issue is the obvious signal transmission loss occurring in the electronic products in high-frequency transmission.

In order to reduce signal transmission loss, or to inhibit signal attenuation as much as possible, the existing technology may inhibit or reduce the insertion loss of the electronic products in high-frequency transmission as much as possible by a compensating method based on the circuit technology, or by the selection of suitable conducting materials and/or dielectric materials, and try to minimize the loss generated by the electronic products in high-frequency transmission.

The selection of suitable conducting materials and/or dielectric materials may reduce the insertion loss of the electronic products in high-frequency transmission, but it also weakens the peel strength between the copper foil and the resin substrate of the copper clad laminate (CCL), which results in the peel-off of the copper foil and the resin substrate of the copper clad laminates in the follow-up processing or application preparation processes, and even affects the defect-free rate of the follow-up products.

Therefore, the technology of how to maintain the desired peel strength between the copper foil and the resin substrate, and simultaneously inhibit or reduce the insertion loss of the electronic products in high-frequency transmission has been the technical issue for researches in the academia and industries.

SUMMARY OF THE INVENTION

To overcome the shortcomings, one purpose of the present invention is to inhibit or reduce the insertion loss of the electronic products in high-frequency transmission under the premise that the desired peel strength between the copper foil and the resin substrate is maintained.

To achieve the above-mentioned purposes, the present invention provides a micro-roughened electrodeposited copper foil, comprising: a micro-rough surface, having multiple copper nodule-free areas and multiple copper nodule-arranged areas, in which part of the copper nodule-free areas are dispersed among the copper nodule-arranged areas; multiple copper nodules, being formed on the micro-rough surface and located in the copper nodule-arranged areas, in which the copper nodules are not located in the copper nodule-free areas, and the copper nodules in each copper nodule-arranged area are arranged and formed along a direction on the micro-rough surface; wherein, in the micro-rough surface of 120 square micrometers (μm$^2$), the number of the copper nodule-free areas is 5 or higher, each copper nodule-free area has a size of 62500 square nanometers (nm$^2$) or higher, each copper nodule-arranged area has a length of 300 nanometers (nm) to 2500 nm, the copper nodules in each copper nodule-arranged area have a mean width of 10 nm to 300 nm, and the number of the copper nodules in each copper nodule-arranged area is 3 to 50. By controlling the surface profile of the micro-roughened electrodeposited copper foil, the present invention not only gives the desired peel strength between the micro-roughened electrodeposited copper foil and the resin substrate, but also inhibits or reduces the insertion loss of the copper clad laminate in high-frequency transmission, thereby promoting the high-frequency signal transmission efficiency of the electronic products comprising the micro-roughened electrodeposited copper foil.

In this disclosure, the term "the micro-rough surface of 120 μm$^2$" refers to the size of a specific area on the micro-rough surface of the micro-roughened electrodeposited copper foil, not to the real size of the micro-rough surface. For example, the micro-rough surface of the micro-roughened electrodeposited copper foil is observed by a scanning electron microscope (SEM) with a magnification of 10,000×, and the image shown in each SEM image corresponds to an area of 12.7 micrometers (μm)×9.46 μm, which is approximately 120 μm$^2$. The structural feature described as "in the micro-rough surface of 120 μm$^2$, the number of the copper nodule-free areas is 5 or higher, and each copper nodule-free area has a size of 62500 nm$^2$ or higher" in the disclosure refers to the number of the copper nodule-free areas with the specific size in the specific range of the micro-rough surface.

It should be understood that the size of the multiple copper nodule-free areas is 62500 nm$^2$ or higher, but the sizes of the multiple copper nodule-free areas are not limited to be the same. In other words, the copper nodule-free areas can have optionally the same or different sizes. For example, part of the copper nodule-free areas may have a size equal to 62500 nm$^2$, and another part of the copper nodule-free areas may have a size of larger than 62500 nm$^2$. In an embodiment, the size of the copper nodule-free areas may be 250 nm×250 nm, but not limited thereto.

Those skilled in the art can understand that, in the micro-rough surface of 120 μm$^2$, the number of the copper nodule-free areas having a size of 62500 nm$^2$ or higher can be 5 or more (inclusive). Preferably, the number of the copper nodule-free areas having a size of 62500 nm$^2$ or higher can be 5 to 100 or more, 10 to 100 or more, even more.

In an embodiment, the size of each copper nodule-free area can be 250 nm×250 nm or higher; namely, each copper nodule-free area can be an approximate square area. In another embodiment, the size of each copper nodule-free area can be 500 nm×250 nm or higher; namely, each copper nodule-free area can be an approximate rectangular area. In the micro-rough surface of 120 μm$^2$, the number of the copper nodule-free areas having a size of 500 nm×250 nm or higher can be 10 to 50. In another embodiment, the size of part of the copper nodule-free areas can be 250 nm×250 nm or higher, and the size of another part of the copper nodule-free areas can be 500 nm×250 nm or higher.

According to the present invention, the copper nodules in each copper nodule-arranged area are arranged and formed along a direction on the micro-rough surface. Specifically, the copper nodules in each copper nodule-arranged area can be optionally arranged side-by-side and formed along the direction on the micro-rough surface. In other words, in an embodiment, when the copper nodules in each copper nodule-arranged area are side-by-side arranged and formed along the direction on the micro-rough surface, the copper nodules are arranged closely adjacent to each other and formed along the direction on the micro-rough surface; and in another embodiment, when the copper nodules in each copper nodule-arranged area are not arranged side-by-side but formed along the direction on the micro-rough surface, the copper nodules are arranged spaced apart and formed along the direction on the micro-rough surface. In some embodiments, the copper nodules in part of the copper nodule-arranged areas are side-by-side arranged and formed along the direction on the micro-rough surface, and the copper nodules in another part of the copper nodule-arranged areas are not side-by-side arranged but formed along the direction on the micro-rough surface. In some embodiments, part of the copper nodules in a copper nodule-arranged area are side-by-side arranged and formed along the direction on the micro-rough surface, and another part of the copper nodules in the copper nodule-arranged area are not side-by-side arranged but formed along the direction on the micro-rough surface.

In this disclosure, the length of a copper nodule-arranged area is the sum of the width values of multiple copper nodules having different or different sizes in this area. The length of each copper nodule-arranged area can be 300 nm to 2500 nm, or 500 nm to 2500 nm.

In an embodiment, the mean width of the copper nodules in each copper nodule-arranged area can be 10 nm to 100 nm, 100 nm to 150 nm, or 150 nm to 280 nm. Preferably, the copper nodules in each copper nodule-arranged area have a mean width of 10 nm to 200 nm. More preferably, the copper nodules in each copper nodule-arranged area have a mean width of 50 nm to 200 nm.

In an embodiment, the number of the copper nodules in each copper nodule-arranged area can be 3 to 6, or 7 to 15, or 16 to 50. Preferably, the number of the copper nodules in each copper nodule-arranged area is 3 to 10. According to the present invention, the roughness (Rz, within JIS94) of the micro-roughened electrodeposited copper foil can be 3.0 μm or lower, 2.0 μm or lower, 1.5 μm or lower, 1.2 μm or lower, 1.0 μm or lower, 0.7 μm or lower, or 0.5 μm or lower. In an embodiment, the Rz of the micro-roughened electrodeposited copper foil can be 1.2 μm to 2.0 μm. In another embodiment, the Rz of the micro-roughened electrodeposited copper foil can be 1.4 μm to 2.5 μm. In another embodiment, the Rz of the micro-roughened electrodeposited copper foil can be 1.0 μm to 1.5 μm.

According to the present invention, the thickness of the micro-roughened electrodeposited copper foil can be 5 μm to 210 μm, but not limited thereto.

To achieve the above-mentioned purposes, the present invention provides a micro-roughened electrodeposited copper foil comprising a micro-rough surface, wherein the micro-rough surface has an Rlr value of 1.05 to 1.60. Alternatively, the present invention provides a micro-roughened electrodeposited copper foil comprising a micro-rough surface, wherein the micro-rough surface has an Sdr value of 0.01 to 0.08.

By controlling the surface characteristics (i.e., Rlr or Sdr value) of the micro-roughened electrodeposited copper foil, the present invention not only gives the desired peel strength between the micro-roughened electrodeposited copper foil and resin substrate, but also inhibits or reduces the insertion loss of the copper clad laminate in high-frequency transmission, thereby promoting the high-frequency signal transmission efficiency of the electronic products comprising the micro-roughened electrodeposited copper foil.

In addition to the controlled Rlr or Sdr value of the micro-roughened electrodeposited copper foil, the micro-roughened electrodeposited copper foil of the present invention also has the above-mentioned surface profile: the micro-rough surface of the micro-roughened electrodeposited copper foil also has multiple copper nodule-free areas and multiple copper nodule-arranged areas; part of the copper nodule-free areas are dispersed among the copper nodule-arranged areas; multiple copper nodules are formed on the micro-rough surface and located in the copper nodule-arranged areas, not located in the copper nodule-free areas; and the copper nodules in each copper nodule-arranged area are arranged and formed along a direction on the micro-rough surface; and, in the micro-rough surface of 120 $\mu m^2$, the number of the copper nodule-free areas is 5 or higher, each copper nodule-free area has a size of 62500 $nm^2$ or higher, each copper nodule-arranged area has a length of 300 nm to 2500 nm, the copper nodules in each copper nodule-arranged area have a mean width of 10 nm to 300 nm, and the number of the copper nodules in each copper nodule-arranged area is 3 to 50.

Preferably, the micro-rough surface has an Rlr value of 1.10 to 1.30. More preferably, the micro-rough surface has an Rlr value of 1.10 to 1.28.

In this disclosure, Rlr refers to an expanded length ratio, i.e., the length ratio of the surface profile of an object per unit length. A higher Rlr value indicates that the surface profile is more uneven, and the surface is completely flat when the Rlr value is equal to 1.

Preferably, the micro-rough surface has an Sdr value of 0.01 to 0.08. More preferably, the micro-rough surface has an Sdr value of 0.010 to 0.023.

In this disclosure, Sdr refers to an expanded interfacial area ratio, i.e., the increment ratio of the projected area of an object per unit area. The surface is completely flat when the Sdr value is equal to 0.

To achieve the above-mentioned purposes, the present invention also provides a copper clad laminate comprising the above-mentioned micro-roughened electrodeposited copper foil and a substrate, wherein the substrate and the micro-roughened electrodeposited copper foil are laminated.

When the micro-roughened electrodeposited copper foil of the present invention is used, since the micro-rough surface of the micro-roughened electrodeposited copper foil has specific surface profile and/or characteristics, the peel strength between the micro-roughened electrodeposited copper foil and the resin substrate in the copper clad laminate meets the industry standard, and the insertion loss of the copper clad laminate in high-frequency transmission can be inhibited or reduced as much as possible, thereby promoting the high frequency signal transmission efficiency of the high-frequency high-speed electronic products comprising the copper clad laminate. For example, the copper clad laminate comprising the micro-roughened electrodeposited copper foil of the present invention can be applied to the fifth generation mobile networks (5G) to achieve the goal of high-frequency high-speed transmission.

According to the present invention, the peel strength between the micro-roughened electrodeposited copper foil and the substrate in the copper clad laminate can be 2.5 pounds per inch (lb/in) or higher, which meets the industry standard. Furthermore, the peel strength between the micro-roughened electrodeposited copper foil and the substrate in the copper clad laminate can be 3.0 lb/in to 5.5 lb/in.

In the performance of the ultra-low-loss copper clad laminate, preferably, the insertion loss at 4 GHz of the copper clad laminate can be −0.26 dB/in to −0.32 dB/in; more preferably, the insertion loss at 4 GHz of the copper clad laminate can be −0.27 dB/in to −0.32 dB/in. Even more preferably, the insertion loss at 4 GHz of the copper clad laminate can be −0.27 dB/in to −0.30 dB/in.

In the performance of the ultra-low-loss copper clad laminate, preferably, the insertion loss at 8 GHz of the copper clad laminate can be −0.41 to −0.51 dB/in; more preferably, the insertion loss at 8 GHz of the copper clad laminate can be −0.43 dB/in to −0.51 dB/in. Even more preferably, the insertion loss at 8 GHz of the copper clad laminate can be −0.43 to −0.48 dB/in.

In the performance of the ultra-low-loss copper clad laminate, preferably, the insertion loss at 12.89 GHz of the copper clad laminate can be −0.57 to −0.73 dB/in; more preferably, the insertion loss at 12.89 GHz of the copper clad laminate can be −0.61 dB/in to −0.73 dB/in. Even more preferably, the insertion loss at 12.89 GHz of the copper clad laminate can be −0.61 dB/in to −0.67 dB/in.

In the performance of the ultra-low-loss copper clad laminate, preferably, the insertion loss at 16 GHz of the copper clad laminate can be −0.67 to −0.83 dB/in; more preferably, the insertion loss at 16 GHz of the copper clad laminate can be −0.71 dB/in to −0.83 dB/in. Even more preferably, the insertion loss at 16 GHz of the copper clad laminate can be −0.71 dB/in to −0.79 dB/in.

According to the present invention, the substrate can have a low dielectric constant and/or a low dissipation factor (Df). The substrate can be a resin substrate (i.e., prepreg, which is semi-cured), which is obtained by impregnating a base body in a synthetic resin and curing the resin-impregnated base body. For example, the base body may be a phenolic cotton paper, a cotton paper, a resin fiber fabric, a resin fiber non-woven fabric, a glass board, a glass woven fabric, or a glass non-woven fabric, but not limited thereto; the synthetic resin may be an epoxy resin, a polyester resin, a polyimide resin, a cyanate ester resin, a bismaleimide triazine resin, polyphenylene ether resin, or phenol resin, but not limited thereto; and the synthetic resin may form a mono-layer or a multiple-layer structure on the base body. In an embodiment, the product numbers of the commercial resin substrates may be TU933$^+$, TU863$^+$, EM890, EM891(K), EM891, IT958G, IT968, IT988G, IT150DA, S7040G, S7439G, Synamic 6GX, Synamic 8G, MEGTRON 4, MEGTRON 6 or MEGTRON 7, but not limited thereto.

BRIEF DESCRIPTION OF THE DRAWINGS

FIG. 1B and FIG. 1C are marked SEM images for illustrating the structural features of the micro-roughened electrodeposited copper foil of Example 1, in which FIG. 1B is a SEM image with a magnification of 10,000×, and the copper nodule-arranged areas are marked thereon; and FIG. 1C is a SEM image with a magnification of 10,000×, and the multiple copper nodule-free areas are marked thereon.

FIG. 2B and FIG. 2C are marked SEM images for illustrating the structural features of the micro-roughened electrodeposited copper foil of Example 2, in which FIG. 2B is a SEM image with a magnification of 10,000×, and the copper nodule-arranged areas are marked thereon; and FIG. 2C is a SEM image with a magnification of 10,000×, and the multiple copper nodule-free areas are marked thereon.

FIG. 3B and FIG. 3C are marked SEM images for illustrating the structural features of the micro-roughened electrodeposited copper foil of Example 3, in which FIG. 3B is a SEM image with a magnification of 10,000×, and the copper nodule-arranged areas are marked thereon; and FIG. 3C is a SEM image with a magnification of 10,000×, and the multiple copper nodule-free areas are marked thereon.

FIG. 5 is a schematic diagram of the 8-layer laminate of Delta L for the insertion loss test.

DETAILED DESCRIPTION OF THE PREFERRED EMBODIMENTS

Figure 1A:
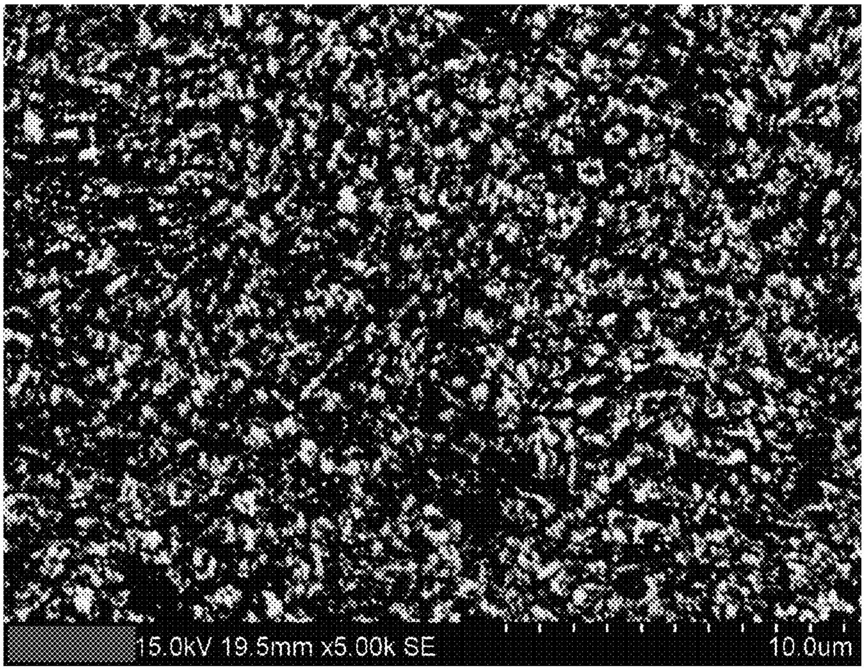
FIG. 1A is a scanning electron microscope (SEM) image of the micro-roughened electrodeposited copper foil of Example 1, with a magnification of 5,000×.

The following Examples are provided to demonstrate the applications of the micro-roughened electrodeposited copper foil and the copper clad laminate comprising the micro-roughened electrodeposited copper foil of the present invention, and Comparative Examples using the commercial copper foil are also provided as the control. Hereinafter, one person skilled in the art can easily realize the advantages and effects of the present invention from the following Examples and Comparative Examples. It should be understood that the Examples provided herein are just used for the purpose of illustrations only, not intended to limit the scope of the present invention. One person skilled in the art can make various modifications and variations in order to practice or apply the present invention in accordance with the ordinary knowledge without departing from the spirit and scope of the present invention.

Examples 1 to 3: Micro-Roughened Electrodeposited Copper Foils

First of all, a copper electrolyte comprising copper ions ($Cu^{2+}$) of about 65 grams per liter (g/L) to 100 g/L, sulfuric acid ($H_2SO_4$) of about 85 g/L to 105 g/L, chloride ions ($Cl^-$) of 1.0 ppm to 30 ppm was prepared, and the resulting copper electrolyte was introduced into a raw foil electrolysis equipment with a rotating cathode roll and an insoluble anode, and a current having a current density of 30 amperes per square decimeter (A/dm$^2$) to 60 A/dm$^2$ was applied to the cathode roll and an insoluble anode to produce a very low profile (VLP) raw foil at a liquid temperature of 50° C. to 58° C., and the VLP raw foil was continuously wound on a guiding roll.

The VLP raw foil was sent at a production speed of 10 meters per minute (m/min) by guiding rolls into the 11 connecting tanks shown in Table 1, and sequentially subjected to the following treatments: one roughening treatment, two curing treatments, two roughening treatments, two curing treatments, one nickel (Ni) electroplating treatment, one zinc (Zn) electroplating treatment, one chromium (Cr) electroplating treatment, and one silanization treatment, to obtain a micro-roughened electrodeposited copper foil having a thickness of about 35 μm.

In the continuous surface treatments in Examples 1 to 3, each of the 11 tanks corresponded to a surface treatment listed in Table 1. The parameters of the preparation processes of the previous 10 tanks, including the main metal ion and its concentration in the electroplating solution, the chloride ion concentration and trace metal concentration in the electroplating solution, the acid and its concentration in the electroplating solution, the liquid temperature and pH value of the electroplating solution, and the treatment time were shown in Table 1. In the eleventh (11$^{th}$) tank, the silane coupling agent used for the silanization treatment was (3-glycidoxypropyl) trimethoxysilane coupling agent with a concentration of 5 g/L to 7 g/L, and the parameters of silanization including the trace metal concentration, the liquid temperature and pH value of the treatment solution, and the treatment time for the silanization treatment tank were also shown in Table 1. The trace metal present in the electroplating solution might be in the form of $Ni^{+2}$, $Pd^{+2}$, $Ag^{+}$, or $W^{+6}$. In the first (1$^{st}$) to seventh (7$^{th}$), ninth (9$^{th}$), and tenth (10$^{th}$) tanks, the trace metal might be $Ni^{+2}$, $Pd^{+2}$, $Ag^{+}$, or $W^{+6}$; in the eighth (8$^{th}$) tank, the trace metal might be $Pd^{+2}$, $Ag^{+}$, or $W^{+6}$; and in the ninth (9$^{th}$) tank, the trace metal might be $Pd^{+2}$, $Ag^{+}$, or $W^{+6}$. The main difference in the surface treatments between the micro-roughened electrodeposited copper foils of Examples 1 to 3 was the current density of each surface treatment, and this parameter of the preparation processes was shown in Table 2. Herein, the deviation of the current density for each surface treatment was controlled within ±10%.

TABLE 1

Parameters of the preparation processes used in the continuous surface treatments for the VLP raw foils of the micro-roughened electrodeposited copper foils of Examples 1 to 3

| Tank No. | 1 | 2 | 3 | 4 | 5 | 6 | 7 | 8 | 9 | 10 | 11 |
|---|---|---|---|---|---|---|---|---|---|---|---|
| Surface treatment | Roughening | Curing | Curing | Roughening | Roughening | Curing | Curing | Ni plating | Zn plating | Cr plating | Silanization |
| Metal ion | $Cu^{+2}$ | $Cu^{+2}$ | $Cu^{+2}$ | $Cu^{+2}$ | $Cu^{+2}$ | $Cu^{+2}$ | $Cu^{+2}$ | $Ni^{+2}$ | $Zn^{+2}$ | $Cr^{+6}$ | N/A |
| Metal ion conc. (g/L) | 5 to 10 | 66 to 80 | 66 to 80 | 5 to 10 | 5 to 10 | 66 to 80 | 66 to 80 | 17 to 20 | 2 to 4 | 1 to 3 | N/A |
| Chloride ion conc. (ppm) | <3 | <3 | <3 | <3 | <3 | <3 | <3 | <3 | <3 | <3 | <3 |
| Acid | Sulfuric acid | Sulfuric Acid | Sulfuric acid | Sulfuric acid | Sulfuric acid | Sulfuric Acid | Sulfuric acid | Phosphoric acid | Boric acid | Phosphoric acid | N/A |
| Acid conc. (g/L) | 90 to 100 | 60 to 75 | 60 to 75 | 90 to 100 | 90 to 100 | 60 to 75 | 60 to 75 | 3 to 6 | 10 to 25 | 0.1 to 2.0 | N/A |
| Trace metal conc. (ppm) | 180 to 220 | 30 to 40 | 30 to 40 | 180 to 220 | 180 to 220 | 30 to 40 | 30 to 40 | 100 to 200 | 100 to 200 | 100 to 200 | N/A |
| Liquid temp. (° C.) | 30 ± 5 | 45 ± 5 | 45 ± 5 | 30 ± 5 | 30 ± 5 | 45 ± 5 | 45 ± 5 | 28 ± 5 | 30 ± 5 | 40 ± 5 | 40 ± 5 |
| pH | <1.5 | <1.5 | <1.5 | <1.5 | <1.5 | <1.5 | <1.5 | 3 to 4 | 4 to 5 | 3 to 4 | 4 to 5 |
| Time (sec.) | 1.5 | 2.25 | 1.5 | 1.5 | 2.25 | 2.25 | 2.06 | 2.25 | 2.06 | 2.25 | 3 |

TABLE 2

Current density (in A/dm$^2$) set in the continuous surface treatments for the VLP raw foils of the micro-roughened electrodeposited copper foils of Examples 1 to 3

| Tank No. | 1 | 2 | 3 | 4 | 5 | 6 | 7 | 8 | 9 | 10 | 11 |
|---|---|---|---|---|---|---|---|---|---|---|---|
| Example 1 | 14.81 | 23.56 | 0.01 | 25.93 | 0.01 | 0.88 | 3.89 | 14.81 | 23.56 | 0.01 | N/A |
| Example 2 | 14.81 | 23.46 | 0.01 | 27.78 | 4.63 | 0.99 | 3.70 | 14.81 | 23.46 | 0.01 | N/A |
| Example 3 | 14.81 | 24.56 | 0.01 | 25.93 | 0.01 | 0.99 | 3.89 | 14.81 | 24.56 | 0.01 | N/A |

Comparative Example: Commercial Copper Foil

Comparative Example was the very low profile copper foil produced by the Furukawa Electric Co., Ltd., with a production number of FT1-UP, which was a commercial copper foil having a weight of 1 ounce (oz) and a thickness of about 35 μm.

Testing Example 1: Surface Profile

In this Testing Example, the micro-roughened electrodeposited copper foils of Examples 1, 2 and 3, and the commercial copper foil of the Comparative Example were used as specimens, and the surface profile of each specimen was observed by the scanning electron microscope (Hitachi S-3400N) with a tilt degree of 35° and a magnification of 5,000× or 10,000×.

Figure 2A:
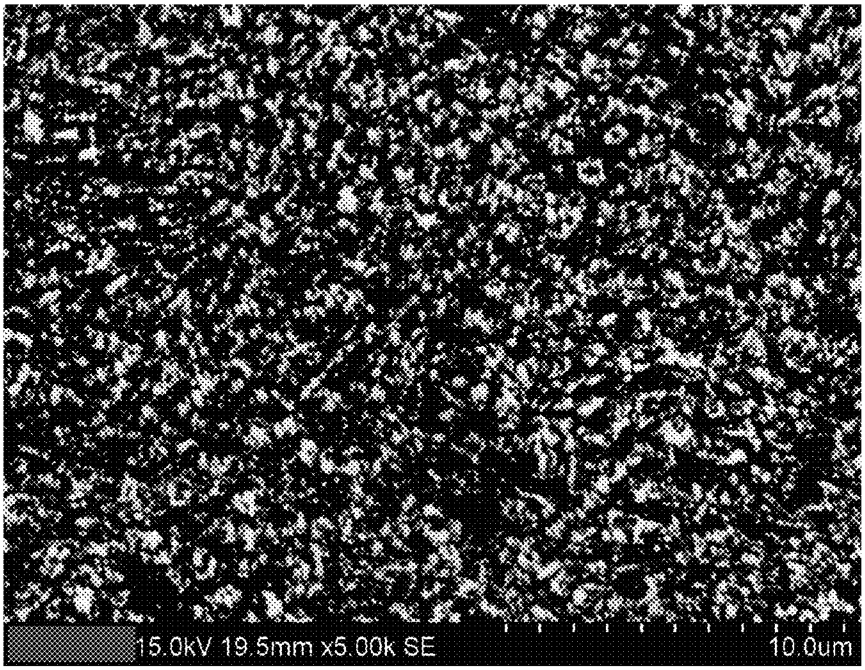
FIG. 2A is a SEM image of the micro-roughened electrodeposited copper foil of Example 2, with a magnification of 5,000×.
Figure 3A:
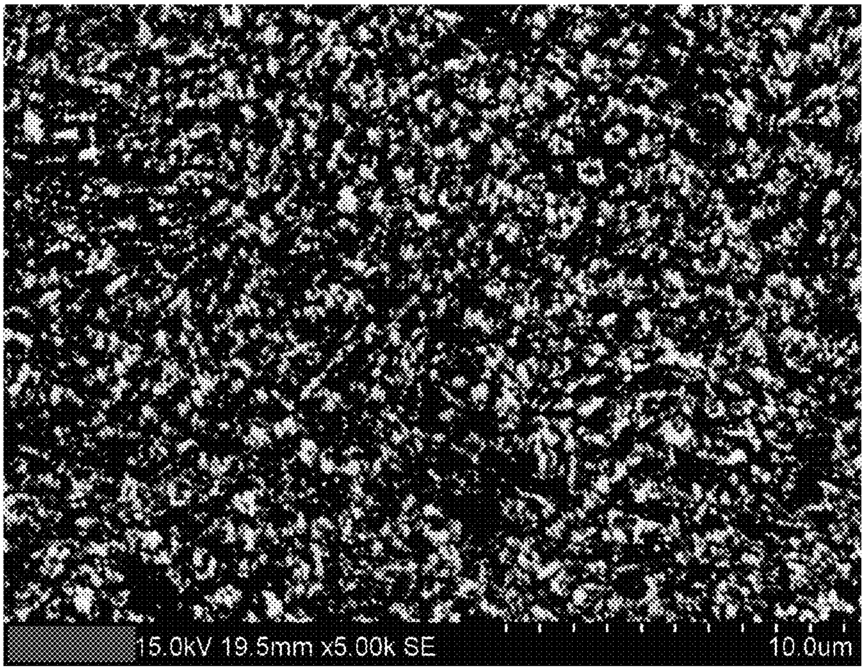
FIG. 3A is a SEM image of the micro-roughened electrodeposited copper foil of Example 3, with a magnification of 5,000×.
Figure 4:
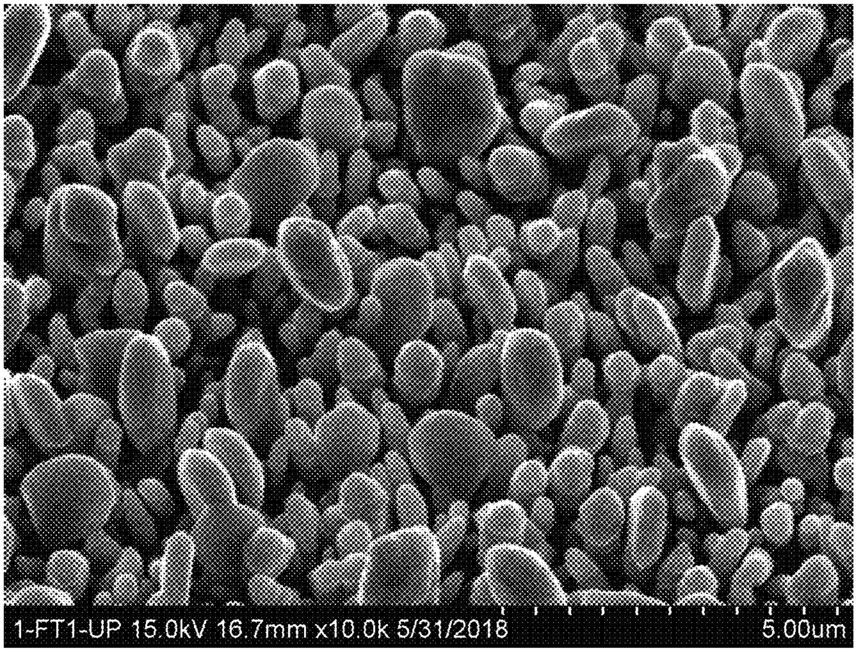
FIG. 4 is a SEM image of the commercial copper foil of the Comparative Example, with a magnification of 10,000×.

The micro-roughened electrodeposited copper foils of Examples 1, 2 and 3 were observed with a magnification of 5,000×, and the SEM images taken were shown in FIGS. 1A, 2A and 3A, respectively. Also, the commercial copper foil of the Comparative Example was observed with a magnification of 10,000×, and the SEM image taken were shown in FIG. 4. As shown in FIGS. 1A, 2A and 3A, the surface profile of the micro-roughened electrodeposited copper foil of the present invention was similar to the structure of gum and teeth, which was different from the evenly dispersed copper nodules in the commercial copper foil shown in FIG. 4.

In addition, the surface profiles of the micro-roughened electrodeposited copper foils of Examples 1, 2, 3 were observed with a magnification of 10,000×, and the SEM images taken were shown in FIGS. 1B and 1C, FIGS. 2B and 2C, FIGS. 3B and 3C, respectively. For further analysis of the surface profiles of the micro-roughened electrodeposited copper foils of Examples 1 to 3, FIGS. 1B and 1C, which were originated from the same SEM image with a magnification of 10,000×, were used, in which the structural features of the copper nodule-arranged areas were marked in FIG. 1B, and the structural features of the copper nodule-free areas were marked in FIG. 1C. Similarly, FIGS. 2B and 2C originated from the same SEM image with a magnification of 10,000×, and FIGS. 3B and 3C originated from the same SEM image with a magnification of 10,000× were used for the surface profile analysis.

Figure 1B:
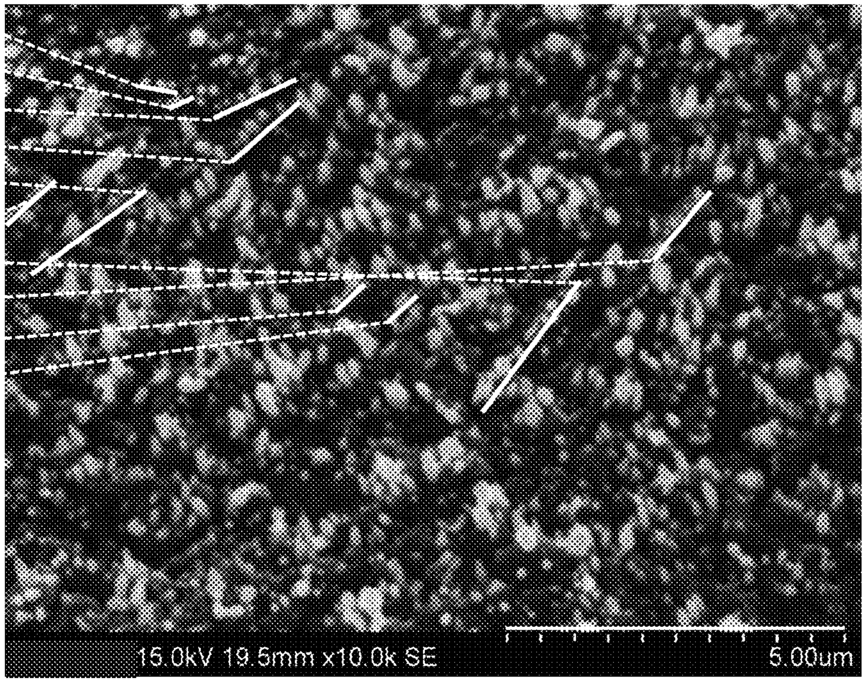
Figure 1C:
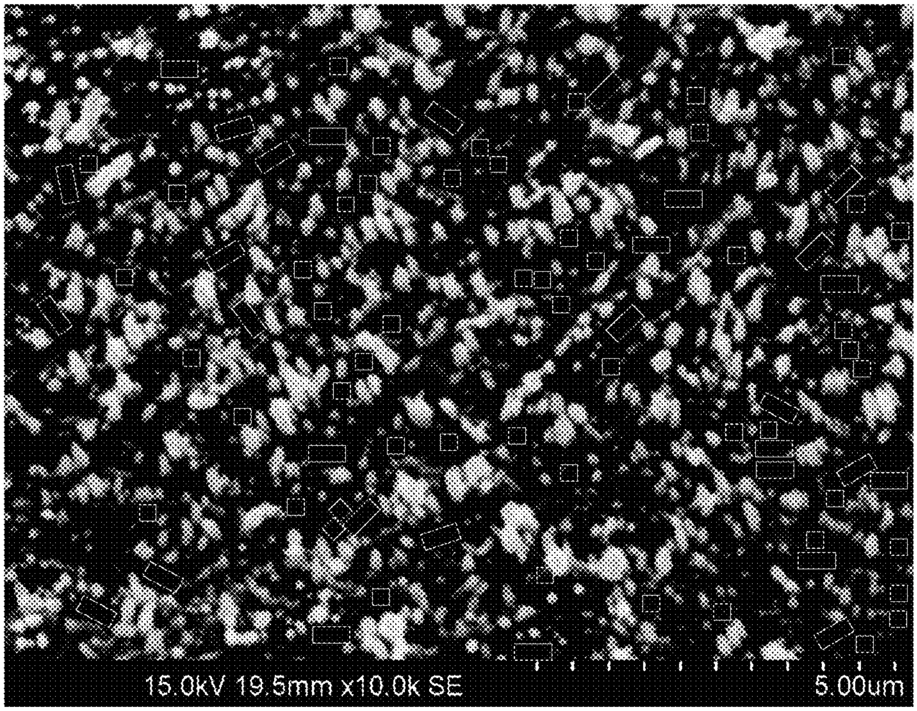
Figure 2B:
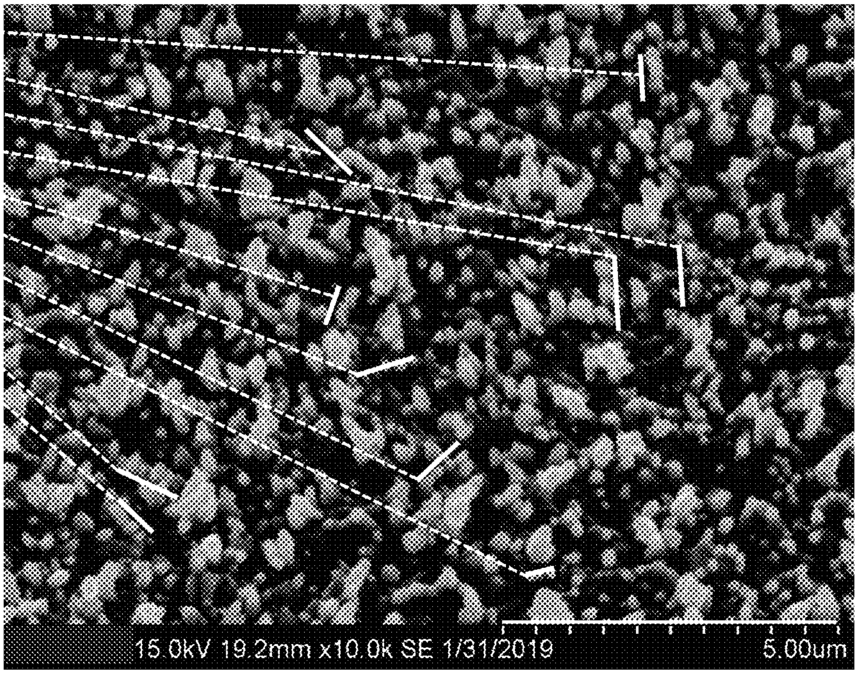
Figure 2C:
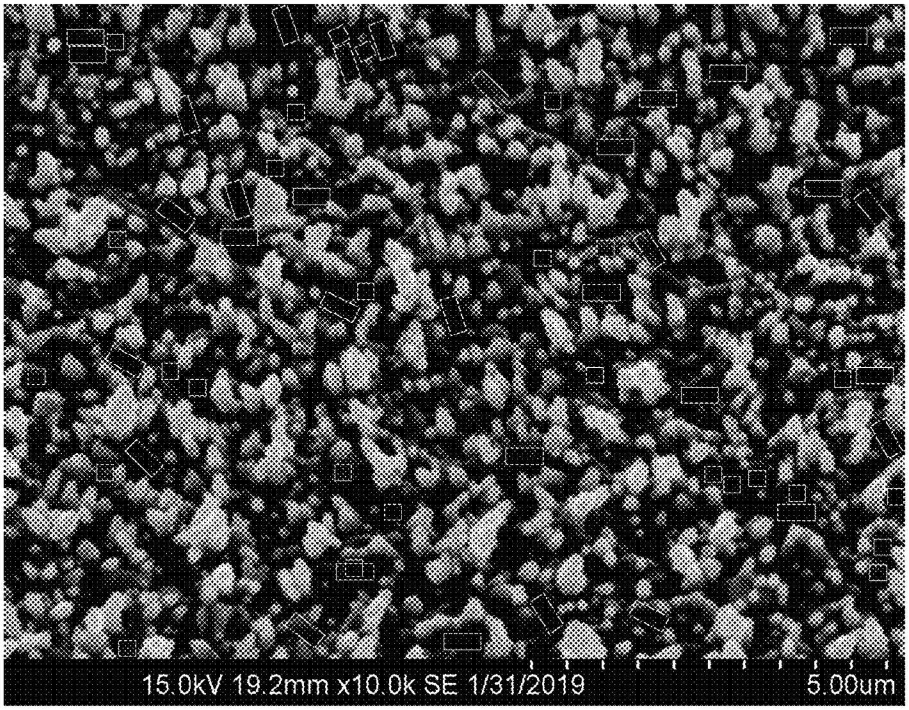
Figure 3B:
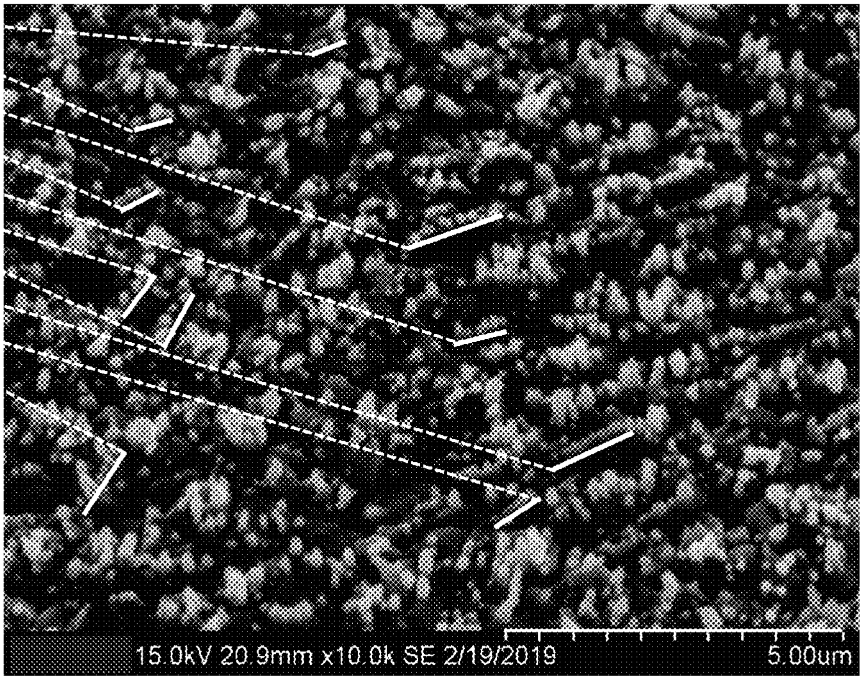
Figure 3C:
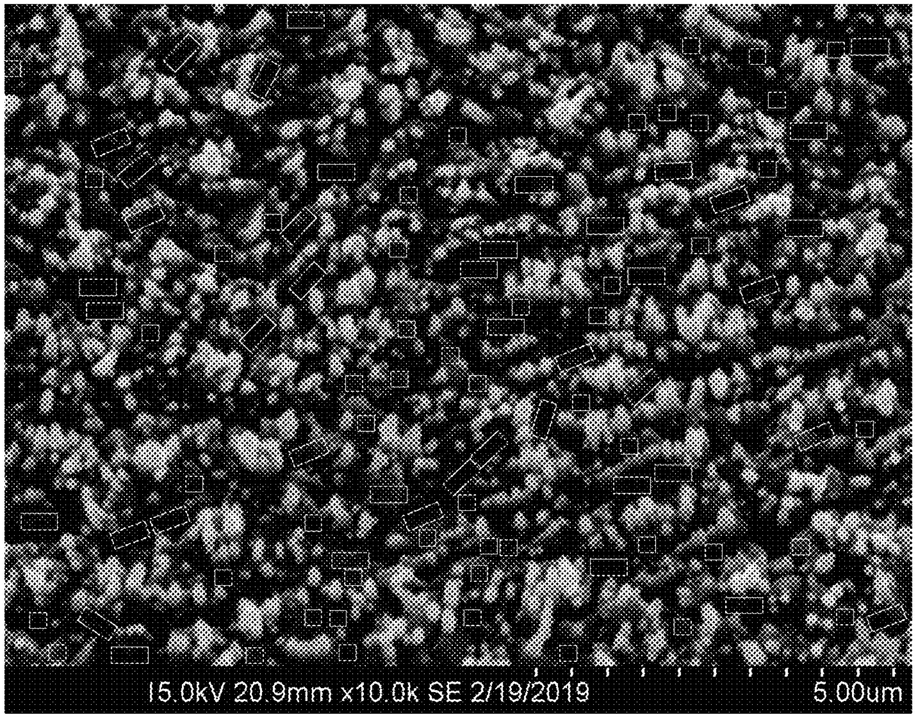

As shown in FIGS. 1A to 1C (Example 1), FIGS. 2A to 2C (Example 2), and FIGS. 3A to 3C (Example 3), the micro-roughened electrodeposited copper foils of Examples 1 to 3 had a micro-rough surface and multiple copper nodules, in which the micro-rough surface had multiple copper nodule-arranged areas and multiple copper nodule-free areas, part of the copper nodule-free areas were dispersed among the copper nodule-arranged areas, the copper nodule-free areas were arranged adjacent to the copper nodule-arranged areas, the copper nodules were formed on the micro-rough surface and located in the copper nodule-arranged areas, the copper nodules were not located in the copper nodule-free areas (i.e., each copper nodule-free area substantively had no copper nodule), the copper nodules in each copper nodule-arranged area were arranged and formed along a direction on the micro-rough surface, and the direction of the arranged copper nodules was approximately equal to the direction of the extended length of the copper nodule-arranged areas.

For further analysis of the surface profile of the micro-roughened electrodeposited copper foils of Examples 1, 2 and 3, the approximately same methods were used for analyzing the multiple copper nodule-arranged areas and the multiple copper nodule-free areas in the micro-roughened electrodeposited copper foils of Examples 1, 2 and 3 in this Testing Example.

Regarding the multiple copper nodule-arranged areas, in the Testing Example 1, the areas adjacent to the copper nodule-arranged areas were pointed and marked with full lines in FIGS. 1B, 2B and 3B, in which multiple copper nodules were formed on the micro-rough surface in each copper nodule-arranged area, and the multiple copper nodules in each copper nodule-arranged area were arranged continuously side-by-side and formed on the micro-rough surface. The copper nodule-arranged areas were designated as the number (No.) 01 to 10. For example, the No. 1B-01 in FIG. 1B corresponded to the measurement result of No. 01 of Example 1 shown in Table 3; the No. 1B-02 in FIG. 1B corresponded to the measurement result of No. 02 of Example 1 shown in Table 3; the No. 2B-01 in FIG. 2B corresponded to the measurement result of No. 01 of Example 2 shown in Table 3. The number (No.) of the copper nodule-arranged areas shown in FIGS. 1B, 2B and 3B can be deduced according to the above examples.

Ten copper nodule-arranged areas (Nos. 01 to 10) in the micro-roughened electrodeposited copper foils of Examples 1, 2 to 3 were randomly selected and measured in accordance with FIGS. 1B, 2B and 3B, respectively. The length of each copper nodule-arranged area, the number of the copper nodules in each copper nodule-arranged area, the mean width of the copper nodules of each copper nodule-arranged area were measured, and the results were listed in Table 3. The individual length of the above-mentioned 10 copper nodule-arranged areas were measured and averaged to obtain the mean length of the multiple copper nodule-arranged areas of Example 1. The individual number of the copper nodules of the above-mentioned 10 copper nodule-arranged areas were measured and averaged to obtain the mean number of the multiple copper nodules of Example 1. In addition, the mean widths of the copper nodules of the above-mentioned 10 copper nodule-arranged areas were measured and averaged to obtain the mean of the mean widths of the multiple copper nodules of Example 1. The calculation results were also listed in Table 3.

TABLE 3

Individual length of 10 copper nodule-arranged areas (Nos. 01 to 10), individual number of copper nodules in 10 copper nodule-arranged areas, and mean width of copper nodules in 10 copper nodule-arranged areas of the micro-roughened electrodeposited copper foils of Examples 1, 2 and 3 respectively measured in accordance with FIGS. 1B, 2B and 3B

| | No. | 01 | 02 | 03 | 04 | 05 | 06 | 07 | 08 | 09 | 10 | Maximum | Minimum | Mean |
|---|---|---|---|---|---|---|---|---|---|---|---|---|---|---|
| Example 1 | Length of each copper nodule-arranged area (nm) | 550 | 390 | 1367 | 1368 | 2130 | 1005 | 2466 | 866 | 587 | 573 | 2466 | 390 | 1130 |
| | Copper nodules number in each copper nodule-arranged area | 3 | 4 | 5 | 7 | 12 | 5 | 12 | 7 | 5 | 4 | 12 | 3 | 6 |
| | Mean width of copper nodules in each copper nodule-arranged area (nm) | 101 | 90 | 130 | 127 | 116 | 114 | 118 | 114 | 107 | 89 | 130 | 89 | 111 |
| Example 2 | Length of each copper nodule-arranged area (nm) | 711 | 969 | 953 | 1172 | 626 | 904 | 863 | 444 | 999 | 714 | 1172 | 444 | 836 |
| | Copper nodules number in each copper nodule-arranged area | 3 | 5 | 4 | 4 | 3 | 5 | 4 | 3 | 5 | 4 | 5 | 3 | 4 |
| | Mean width of copper nodules in each copper nodule-arranged area (nm) | 236 | 260 | 263 | 228 | 147 | 146 | 166 | 107 | 128 | 118 | 263 | 107 | 180 |
| Example 3 | Length of each copper nodule-arranged area (nm) | 530 | 585 | 539 | 645 | 815 | 808 | 922 | 1502 | 810 | 1115 | 1502 | 530 | 827 |

TABLE 3-continued

Individual length of 10 copper nodule-arranged areas (Nos. 01 to 10), individual number of copper nodules in 10 copper nodule-arranged areas, and mean width of copper nodules in 10 copper nodule-arranged areas of the micro-roughened electrodeposited copper foils of Examples 1, 2 and 3 respectively measured in accordance with FIGS. 1B, 2B and 3B

| No. | 01 | 02 | 03 | 04 | 05 | 06 | 07 | 08 | 09 | 10 | Maximum | Minimum | Mean |
|---|---|---|---|---|---|---|---|---|---|---|---|---|---|
| Copper nodules number in each copper nodule-arranged area | 3 | 3 | 9 | 4 | 5 | 3 | 4 | 10 | 6 | 6 | 10 | 3 | 5 |
| Mean width of copper nodules in each copper nodule-arranged area (nm) | 153 | 188 | 124 | 88 | 79 | 88 | 98 | 89 | 79 | 63 | 188 | 63 | 105 |

Regarding the multiple copper nodule-free areas, in Testing Example 1, the copper nodule-free areas having a size of 250 nm×250 nm (62,500 $nm^2$) were marked by squares, and the copper nodule-free areas having a size of 500 nm×250 nm (125,000 $nm^2$) were marked by rectangles in FIGS. 1C, 2C and 3C, in which each copper nodule-free area substantively had no copper nodule. The numbers of copper nodule-free areas in different sizes were listed in Table 4, in which the number of copper nodule-free areas of 250 nm×250 nm is the sum of the number of squares and 2× the number of rectangles marked in the figures. Table 4: Numbers of the copper nodule-free areas in different sizes in the micro-roughened electrodeposited copper foils of Examples 1 to 3 calculated in accordance with FIG. 1C, FIG. 2C and FIG. 3C

| | Number of the copper nodule-free areas having a size of 250 nm × 250 nm | Number of the copper nodule-free areas having a size of 500 nm × 250 nm |
|---|---|---|
| Example 1 | >50 | >20 |
| Example 2 | 32 | 11 |
| Example 3 | >70 | >30 |

In the further comparison of FIGS. 1A to 1C, FIGS. 2A to 2C, FIGS. 3A to 3C and FIG. 4, it was clear that the surface profile of the commercial copper foil of the Comparative Example was obviously different from those of the micro-roughened electrodeposited copper foils of Examples 1 to 3. For example, in the commercial copper foil of the Comparative Example shown in FIG. 4, the phenomenon that multiple copper nodules were arranged and formed in a specific direction on the micro-rough surface was not observed, and the phenomenon that copper nodule-free areas were dispersed among copper nodule-arranged areas was not observed, either. According to the above analysis, it was clear that the surface profile of the micro-roughened electrodeposited copper foils of Examples 1, 2 and 3 was obviously different from that of the commercial copper foil of the Comparative Example.

Testing Example 2: Surface Characteristics

In this Testing Example, the micro-roughened electrodeposited copper foils of Examples 1, 2 and 3 and the commercial copper foil of the Comparative Example were used as the specimens, and Sdr values of randomly selected five points on each specimen were measured by the ISO 25178-2012 method using a contact-free scanning laser microscope (purchased from Keyence Corporation, with the controller of VK-X150K and a measurement head of VK-X160K) with a magnification of objective lens of 50× (×50), an L-filter (λc) of 0.2 mm, and an S-filter (λs) of 2 μm, and the resulting values were averaged to obtain the mean Sdr.

In addition, in this Testing Example, the micro-roughened electrodeposited copper foils of Examples 1, 2 and 3 and the commercial copper foil of the Comparative Example were used as the specimens and Rlr values of randomly selected five points of each specimen were measured by the contact-free scanning laser microscope (purchased from Keyence Corporation, with the controller of VK-X150K, a measurement head of VK-X160K) with a magnification of objective lens of 50× (×50), an L-filter (λc) of 0, and an S-filter (λs) of 0, and the resulting values were averaged to obtain the mean Rlr. Table 5: Individual Sdr and Rlr values and their mean values measured with the micro-roughened electrodeposited copper foils of Examples 1 to 3 and the commercial copper foil of the Comparative Example

| Example No. | Data No./Mean | Sdr | Rlr |
|---|---|---|---|
| Example 1 | 1 | 0.0295 | 1.36 |
| | 2 | 0.0243 | 1.33 |
| | 3 | 0.0349 | 1.39 |
| | 4 | 0.0313 | 1.37 |
| | 5 | 0.0294 | 1.36 |
| | Mean | 0.0299 | 1.36 |
| Example 2 | 1 | 0.0431 | 1.52 |
| | 2 | 0.0298 | 1.42 |
| | 3 | 0.0493 | 1.51 |
| | 4 | 0.0482 | 1.53 |
| | 5 | 0.0428 | 1.49 |
| | Mean | 0.0427 | 1.49 |
| Example 3 | 1 | 0.0169 | 1.21 |
| | 2 | 0.0198 | 1.24 |
| | 3 | 0.0214 | 1.28 |
| | 4 | 0.0153 | 1.20 |
| | 5 | 0.0170 | 1.22 |
| | Mean | 0.0181 | 1.23 |
| Comparative Example | 1 | 0.1185 | 1.69 |
| | 2 | 0.1221 | 1.73 |
| | 3 | 0.1144 | 1.68 |
| | 4 | 0.1334 | 1.77 |
| | 5 | 0.1375 | 1.77 |
| | Mean | 0.1252 | 1.73 |

From Table 5, it was clear that the Rlr values of the micro-roughened electrodeposited copper foils of Examples 1 to 3 were in the range of 1.05 to 1.60, and the Rlr values of the commercial copper foil of the Comparative Example and the mean value thereof were higher than 1.60. In addition, the Sdr values of the micro-roughened electrodeposited copper foils of Examples 1 to 3 were in the range of 0.01 to 0.08, and the Sdr values of the commercial copper foil of the Comparative Example and the mean value thereof reached 0.1. From the above analysis, it was clear that the Rlr values of the micro-roughened electrodeposited copper foils of Examples 1, 2 and 3 were obviously different from the Rlr values of the commercial copper foil of the Comparative Example, and the Sdr values of the micro-roughened electrodeposited copper foils of Examples 1, 2 and 3 were also obviously different from the Sdr values of the commercial copper foil of the Comparative Example.

Testing Example 3: Peel Strength

Two kinds of specimens were prepared by the following methods in this Testing Example.

First, two pieces of each of the micro-roughened electrodeposited copper foils of Examples 1, 2 and 3, which were not subjected to the eleventh ($11^{th}$) surface treatment of silanization (i.e., not coated with any silane coupling agent), were adhered to the two sides of the MEGTRON 7 substrate respectively with their micro-rough surfaces, and laminated in accordance with the suggestions from MEGTRON 7, to give the copper clad laminates of Examples 1A, 2A and 3A. The copper clad laminates of Examples 1A, 2A and 3A were used as the specimens for testing the peel strength of the copper clad laminates without the silane coupling agent coating.

And, two pieces of each of the micro-roughened electrodeposited copper foils of Examples 1, 2, 3 and the commercial copper foil of the Comparative Example, which were coated with 5 g/L to 7 g/L of (3-glycidoxypropyl) trimethoxysilane coupling agent, were adhered to the two sides of a MEGTRON 7 substrate respectively with their micro-rough surfaces, and laminated in accordance with the suggestions from MEGTRON 7, to give the copper clad laminates of Examples 1B, 2B, 3B and Comparative Example B. The copper clad laminates of Examples 1B, 2B, 3B and Comparative Example B were used as the specimens for testing the peel strength of the copper clad laminates with the silane coupling agent coating.

Then the peel strength of the copper clad laminates of Examples 1A to 3A, Examples 1B to 3B and Comparative Example B was measured by the IPC-TM-650 2.4.8 test method, and the results were shown in the following Table 6.

Table 6: Peel strength of copper clad laminates prepared by the micro-roughened electrodeposited copper foils of Examples 1 to 3 and/or the commercial copper foil of the Comparative Example with or without the silane coupling agent coating

| | Example 1 | Example 2 | Example 3 | Comparative Example |
|---|---|---|---|---|
| Specimen without the silane coupling agent coating | 3.03 lb/in | 3.05 lb/in | 3.08 lb/in | — |
| Specimen with the silane coupling agent coating | 4.99 lb/in | 5.01 lb/in | 5.16 lb/in | 4.79 lb/in |

From the results of Table 6, it was clear that when the copper clad laminates were prepared by any of the micro-roughened electrodeposited copper foils of Examples 1 to 3 without the silane coupling agent coating, they satisfied the requirement that the peel strength between the micro-roughened electrodeposited copper foil and the resin substrate was at least 2.5 lb/in. Additionally, in the copper clad laminates prepared by any of the micro-roughened electrodeposited copper foils of Examples 1 to 3 with the silane coupling agent coating, the peel strength between the micro-roughened electrodeposited copper foil and the resin substrate could be increased to 4.9 lb/in or higher, which was obviously higher than the peel strength between the commercial copper foil of the Comparative Example and the resin substrate.

From the results of the Testing Examples 1 to 3, it was clear that controlling of the surface profile and/or characteristics of the micro-roughened electrodeposited copper foils of Examples 1 to 3 was advantageous for promoting the peel strength between the micro-roughened electrodeposited copper foil and the resin substrate, and the peel strength could reach at least 2.5 lb/in or higher when the silane coupling agent was omitted in the micro-roughened electrodeposited copper foils.

In addition, in the comparison of the peel strength between any of the micro-roughened electrodeposited copper foils of Examples 1 to 3 and the resin substrate, it was clear that increasing the number of the copper nodule-free areas in the micro-roughened electrodeposited copper foil and reducing the mean width of copper nodules in the copper nodule-arranged areas were more advantageous for promoting the peel strength, so the peel strength between the micro-roughened electrodeposited copper foil of Example 3 and the resin substrate was superior than the peel strength between any of the micro-roughened electrodeposited copper foils of Examples 1 and 2 and the resin substrate.

Testing Example 4: Insertion Loss

Any of the micro-roughened electrodeposited copper foils of Examples 1, 2, 3 and the commercial copper foil of the Comparative Example, and the prepreg (purchased from Elite Material Co. Ltd., with a product No. of EM890) were used to prepare an 8-layer laminate of Delta L as shown in FIG. 5. The laminates were prepared and their insertion loss was tested according to the Delta L methodology provided by INTEL. The test coupon preparation and the testing method met the standards of the Delta L methodology. For example, the copper clad laminates of Examples 1C, 2C, 3C and the Comparative Example C were used as the test coupons for testing the insertion loss. In a condition that the characteristic impedance of all test coupons was 85 Ω±10%, a network analyzer was used to measure the insertion loss at 4 GHz, 8 GHz, 12.89 GHz, and 16 GHz of the L6 copper foil of each test coupon. The results were listed in the following Table 7.

Table 7: Insertion loss of the copper clad laminates of Examples 1C to 3C and Comparative Example C prepared by the micro-roughened electrodeposited copper foils of Examples 1 to 3 and the commercial copper foil of the Comparative Example

| | 4 GHz | 8 GHz | 12.89 GHz | 16 GHz |
|---|---|---|---|---|
| Example 1C | −0.297 dB/in | −0.469 dB/in | −0.657 dB/in | −0.774 dB/in |
| Example 2C | −0.311 dB/in | −0.493 dB/in | −0.691 dB/in | −0.813 dB/in |
| Example 3C | −0.287 dB/in | −0.454 dB/in | −0.637 dB/in | −0.749 dB/in |
| Comparative Example C | −0.330 dB/in | −0.529 dB/in | −0.747 dB/in | −0.880 dB/in |

As shown in Table 7, the insertion loss of the copper clad laminates of Examples 1C to 3C at 4 GHz, 8 GHz, 12.89 GHz, and 16 GHz was lower than the insertion loss of the copper clad laminate of Comparative Example C. From the results of Testing Examples 1, 2 and 4, it was clear that controlling the surface profile and/or characteristics of the micro-roughened electrodeposited copper foils of Examples 1 to 3 was advantageous for reducing the insertion loss of the copper clad laminates.

Besides, in the comparison of the insertion loss of the copper clad laminates of Examples 1C to 3C, it was clear that the design of copper nodule-free areas, which included increasing the number of the copper nodule-free areas in the micro-roughened electrodeposited copper foil and reducing the mean width of the copper nodules in the copper nodule-arranged areas, could decrease the obstacles in the electron paths of the micro-rough surface and shorten the electron path distance during signal transmission, and it was more advantageous for inhibiting the insertion loss of the copper clad laminate, so the insertion loss of the copper clad laminate of Example 3C was lower than the insertion loss of the copper clad laminates of Examples 1C and 2C, thereby optimizing the signal transmission efficiency at high frequencies. From above, it was clear that a greater number of copper nodule-free areas and a narrower mean width of the copper nodules contributed to increase the signal integrity (SI), namely, to reduce the insertion loss.

In addition, reducing the Rlr value or Sdr value of the micro-roughened electrodeposited copper foil was also advantageous for inhibiting the insertion loss of the copper clad laminate, so the insertion loss of the copper clad laminate of Example 3C was lower than the insertion loss of the copper clad laminates of Examples 1C and 2C. Thus, it was clear that the reduction of Rlr value or Sdr value of the micro-roughened electrodeposited copper foil was helpful to promote the signal integrity and reduce the insertion loss of the copper clad laminates. In brief, when the micro-roughened electrodeposited copper foil of Example 3 was applied to the copper clad laminate, it could further inhibit the signal loss of the copper clad laminate at a high frequency, and promote the effect and quality of the follow-up products using the copper clad laminate.

Discussion of Experimental Results

From the above experimental results, it was clear that controlling the surface profile (i.e., multiple copper nodule-free areas and multiple copper nodule-arranged areas having specific sizes and structure features) and/or the surface characteristics (i.e., Rlr value and/or Sdr value in specific ranges) of the micro-roughened electrodeposited copper foils of Examples 1 to 3 could shorten the electron path distance in the copper nodule-free areas (with a structure similar to the gum) to reduce the insertion loss of the copper clad laminates at a high-frequency transmission; and it also could make the copper nodule-arranged areas (with a structure designed similar to the teeth) advantageous for promoting the peel strength between the micro-roughened electrodeposited copper foil of the present invention and the resin substrate. Accordingly, the copper clad laminate comprising any of the micro-roughened electrodeposited copper foils of Examples 1 to 3 could comprehensively inhibit or reduce the insertion loss of the copper clad laminate at a high frequency (4 GHz, 8 GHz, 12.89 GHz, and 16 GHz) under the premise that the desired peel strength between the copper foil and the resin substrate is maintained, thereby promoting the high-frequency transmission efficiency. Additionally, when a coating of a silane coupling agent was not comprised, the present invention could give the desired peel strength, and promote the effect and quality of the follow-up products comprising the copper clad laminate.

In summary, the present invention can comprehensively inhibit or reduce the insertion loss of the copper clad laminate in high-frequency transmission resulted from the copper foil under the premise that the desired peel strength between the copper foil and the resin substrate is maintained by controlling the surface profile and surface characteristics of the micro-roughened electrodeposited copper foil, thereby promoting the efficiency of high-frequency signal transmission of the electronic products.

What is claimed is:

1. A micro-roughened electrodeposited copper foil comprising a micro-rough surface, wherein the micro-rough surface has an Rlr value of 1.05 to 1.60.

2. The micro-roughened electrodeposited copper foil as claimed in claim 1, wherein the micro-rough surface has an Sdr value of 0.01 to 0.08.

3. The micro-roughened electrodeposited copper foil as claimed in claim 1, wherein the micro-rough surface has an Rlr value of 1.10 to 1.30, and the micro-rough surface has an Sdr value of 0.010 to 0.023.

4. The micro-roughened electrodeposited copper foil as claimed in claim 1, wherein the micro-rough surface has an Rlr value of 1.10 to 1.28, and the micro-rough surface has an Sdr value of 0.010 to 0.023.

5. A copper clad laminate, comprising the micro-roughened electrodeposited copper foil as claimed in claim 1, and a substrate; wherein the substrate and the micro-roughened electrodeposited copper foil are laminated.

6. The copper clad laminate as claimed in claim 5, wherein the copper clad laminate has an insertion loss at 4 GHz of −0.26 dB/in to −0.32 dB/in.

7. The copper clad laminate as claimed in claim 5, wherein the copper clad laminate has an insertion loss at 8 GHz of −0.41 dB/in to −0.51 dB/in.

8. The copper clad laminate as claimed in claim 5, wherein the copper clad laminate has an insertion loss at 12.89 GHz of −0.57 dB/in to −0.73 dB/in.

9. The copper clad laminate as claimed in claim 5, wherein the copper clad laminate has an insertion loss at 16 GHz of −0.67 dB/in to −0.83 dB/in.

* * * * *